United States Patent
Glenn

(10) Patent No.: US 6,274,927 B1
(45) Date of Patent: Aug. 14, 2001

(54) PLASTIC PACKAGE FOR AN OPTICAL INTEGRATED CIRCUIT DEVICE AND METHOD OF MAKING

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/324,710

(22) Filed: Jun. 3, 1999

(51) Int. Cl.[7] .................................................. H01L 23/02
(52) U.S. Cl. ........................ 257/680; 257/680; 257/704; 257/710
(58) Field of Search .................................. 257/680, 701, 257/704, 710, 702; 361/783

(56) References Cited

U.S. PATENT DOCUMENTS

| | | | |
|---|---|---|---|
| 3,838,984 | | 10/1974 | Crane et al. ............................. 37/83 |
| 4,691,225 | | 9/1987 | Murakami et al. ..................... 357/80 |
| 4,801,998 | | 1/1989 | Okuaki .................................. 357/72 |
| 5,057,905 | * | 10/1991 | Matsumoto ............................ 357/74 |
| 5,070,041 | * | 12/1991 | Katayama et al. .................... 437/214 |
| 5,117,279 | * | 5/1992 | Karpman ............................... 357/72 |
| 5,122,862 | * | 6/1992 | Kajihara et al. ....................... 357/74 |
| 5,159,432 | * | 10/1992 | Ohkubo et al. ........................ 357/74 |
| 5,230,759 | * | 7/1993 | Hiraiwa ................................. 156/69 |
| 5,256,901 | * | 10/1993 | Ohashi et al. ......................... 257/680 |
| 5,258,094 | | 11/1993 | Furui et al. ............................ 156/634 |
| 5,336,931 | | 8/1994 | Juskey et al. ......................... 257/787 |
| 5,435,057 | | 7/1995 | Bindra et al. .......................... 29/830 |
| 5,436,203 | | 7/1995 | Lin ......................................... 437/209 |
| 5,497,032 | * | 3/1996 | Tsuji et al. ............................. 257/710 |

(List continued on next page.)

FOREIGN PATENT DOCUMENTS

| 4319786 A1 | * | 12/1993 | (EP) | ..................................... 257/704 |
|---|---|---|---|---|
| 0 687 008 | | 12/1995 | (EP) | ............................. H01L 23/495 |
| 55-53447 | * | 4/1980 | (JP) | ..................................... 257/704 |
| 56 019646 | | 2/1981 | (JP) | . |
| 57-132343 | * | 8/1982 | (JP) | ..................................... 257/704 |
| 59-167037 | | 9/1984 | (JP) | . |
| 62-21250 | * | 1/1987 | (JP) | ..................................... 257/704 |
| 62-145748 | * | 6/1987 | (JP) | ..................................... 257/704 |
| 63-127556 | * | 5/1988 | (JP) | ..................................... 257/704 |
| 64-28952 | * | 1/1989 | (JP) | ..................................... 257/704 |
| 64-54749 | | 3/1989 | (JP) | . |
| 7-312405 | | 11/1995 | (JP) | . |
| 8-125066 | | 5/1996 | (JP) | . |
| 8-306853 | | 11/1996 | (JP) | . |

(List continued on next page.)

Primary Examiner—Eddie C. Lee
Assistant Examiner—Lourdes Cruz
(74) Attorney, Agent, or Firm—Skjerven Morrill Mac Pherson LLP; James E. Parsons

(57) ABSTRACT

A package for an integrated circuit device having an optical cell is disclosed. A method of making the package also is disclosed. The package includes a base of molded encapsulant material. A metal leadframe is embedded in the plastic base at the upper surface of the base. Encapsulant material covers the lower and side surfaces of the die pad and the leads of the leadframe, but does not cover the upper surfaces of the die pad and leads. The side surfaces of the die pad and leads have locking features for engaging the encapsulant material. An optical integrated circuit device is attached to the exposed surface of the die pad. An adhesive bead is applied around the optical device on the exposed upper surface of the leads. An optically clear cover is placed on and, in some embodiments, pressed into the still-viscous adhesive bead. When hardened, the bead supports the cover above the optical device. The side surfaces of the optically clear cover, or the surface of the cover facing the optical device, are provided with locking features that engage the adhesive bead and strengthen the connection between the cover and the adhesive bead.

40 Claims, 14 Drawing Sheets

U.S. PATENT DOCUMENTS

| | | | |
|---|---|---|---|
| 5,529,959 | 6/1996 | Yamanaka | 437/216 |
| 5,644,169 * | 7/1997 | Chun | 257/787 |
| 5,656,857 | 8/1997 | Kishita | 257/690 |
| 5,776,798 | 7/1998 | Quan et al. | 438/112 |
| 5,859,471 | 1/1999 | Kuraishi et al. | 257/666 |
| 5,861,680 | 1/1999 | Yamanaka | 257/793 |
| 5,866,953 | 2/1999 | Akram et al. | 257/790 |
| 5,867,368 | 2/1999 | Glenn | 361/783 |
| 5,877,043 | 3/1999 | Alcoe et al. | 438/123 |
| 5,877,546 * | 3/1999 | You | 257/680 |
| 5,893,723 | 4/1999 | Yamanaka | 438/65 |
| 5,895,222 | 4/1999 | Moden et al. | 438/4 |
| 5,905,301 * | 5/1999 | Ichikawa et al. | 257/676 |
| 5,949,655 * | 9/1999 | Glenn | 361/783 |
| 5,950,074 | 9/1999 | Glenn et al. | 438/121 |
| 5,962,810 | 10/1999 | Glenn | 174/52.2 |
| 5,972,738 | 10/1999 | Vongfuangfoo et al. | 438/124 |
| 5,981,314 | 11/1999 | Glenn et al. | 438/127 |
| 5,989,941 | 11/1999 | Wensel | 438/127 |
| 5,998,862 * | 12/1999 | Yamanaka | 257/704 |
| 6,034,429 | 3/2000 | Glenn et al. | 257/701 |
| 6,092,281 | 7/2000 | Glenn | 29/841 |
| 6,117,705 | 9/2000 | Glenn et al. | 438/106 |

FOREIGN PATENT DOCUMENTS

| | | | |
|---|---|---|---|
| 9-8205 | 1/1997 | (JP) . | |
| 9-8206 | 1/1997 | (JP) . | |
| 9-8207 | 1/1997 | (JP) . | |
| 9-92775 | 4/1997 | (JP) . | |
| WO 98/48461 | 10/1998 | (WO) | H01L 31/0203 |
| WO 99/13516 | 3/1999 | (WO) | H01L 31/0203 |

* cited by examiner

PLASTIC PACKAGE FOR AN OPTICAL INTEGRATED CIRCUIT DEVICE AND METHOD OF MAKING

FIELD OF THE INVENTION

The present invention is directed towards an improved plastic package for an integrated circuit device, and a method of making such a package.

BACKGROUND OF THE INVENTION

Integrated circuit device are conventionally enclosed in plastic packages that provide protection from hostile environments and enable electrical interconnection between the integrated circuit device and printed circuit boards. FIG. 1 is a cross sectional view of an inexpensive, conventional molded plastic package 1 known as a plastic dual in line package ("p-dip"). The elements of package 10 include an integrated circuit device 12, adhesive material (not shown) to attach integrated circuit device 12 to die pad 17, bond wires 13 that electrically connect bonding pads 14 on integrated circuit device 12 to individual leads 15 of the leadframe, and an adhesive plastic encapsulant material which covers the other components and forms package body 16.

In FIG. 1, molding compound (a.k.a., encapsulant material) is molded above and below device 12, leads 15 and die pad 17 to form package body 16. The peripheral sides 18 of package body 16 are sloped to facilitate release from the mold used to make the package. Leads 15 extend from package body 16. There are a variety of well-known alternative styles for the finishing the leads of such a package, including PLCC and gull wing styles.

Further background information concerning conventional plastic integrated circuit packages and leadframes is contained in chapter 8 of the book Microelectronics Packaging Handbook (1989), which was edited by R. Tummala and E. Rymaszewski, and is published by Van Nostrand Reinhold, 115 Fifth Avenue, New York, N.Y.

The operation of certain types of optical integrated circuit devices, such as erasable programmable read-only memory devices ("EPROM"), charge coupled devices ("CCD"), and camera-type devices require that light be applied to a light-sensitive cell on a surface of the device. For such devices, standard p-dip packages cannot be used. FIG. 2 is an example of a conventional molded package 20 for an optical integrated circuit device 23.

Package 20 includes some of the same features as package 10 of FIG. 1, so the same reference numbers will be used in FIG. 2. Package 20 of FIG. 2 includes leads 15 and die pad 17, upon which optical integrated circuit device 23 rests. Bond wires 13 extend between individual bonding pads 14 on optical device 23 and an individual lead 15. Encapsulant material is molded above and below the leadframe to form package body 25.

Below leads 15, package 20 of FIG. 2 is the same as package 10 of FIG. 1. Above leads 15, however, package 20 is modified to accommodate optical integrated circuit device 23. In particular, a portion of molded package body 25, namely, support structure 21, is formed on and above portions of leads 15. Support structure 21, which is integral with package body 25 and formed of the same material, surrounds optical device 23 and supports an optically clear plastic or glass cover 27 above optical device 23. Cover 19 transmits light to a light sensitive cell 24 on optical device 23.

Package 20 of FIG. 2 has two significant drawbacks. First, it is difficult to make. Second, it is expensive. Accordingly, there is a need for an inexpensive, easy-to-make package for optical integrated circuit devices.

SUMMARY OF THE INVENTION

The present invention includes improved packages for optical integrated circuit devices, and methods of making such packages. In one embodiment, a package within the present invention includes an optical integrated circuit device on a die pad. Metal bonding pads on the optical device are connected by bond wires to leads. The lower half of the package, which supports the die pad and leads, is molded insulative adhesive encapsulant material. The lower and side surfaces of the die pad and leads are covered with encapsulant material, so that the die pad and leads are in an embedded connection with the molded package base. The upper surfaces of the die pad and leads are not covered by the encapsulant material. The side surfaces of the die pad and leads have reentrant portions and asperities that lock the die pad and leads to the molded base. An initially viscous and subsequently hardened insulative adhesive bead surrounds the optical integrated circuit device. The bead extends above the upper surface of the optical device and the bond wires. An optically clear cover, which may be formed of borosilicate glass or optically clear plastic, is adhesively connected to and supported above the device by the bead. For example, the bead is in a press-fitted interconnection with the bead. The cover transmits light to a light-sensitive cell on the upper surface of the optical device. The optically clear cover includes locking features which enhance the connection of the cover to the adhesive bead and thus to the package.

A method within the present invention for making such a package includes a first step of providing a leadframe including a die pad and radiating leads. The leadframe is conventional, except that the normally orthogonal side surfaces of the die pad and leads have been modified to include a reentrant portion and asperities that lock the leadframe to the plastic encapsulating material.

Step 2 places the leadframe in a conventional two-pocket mold. The upper pocket of the mold is blanked out by a bar so that encapsulant material does not enter the pocket. Insulative encapsulant material is provided to the lower pocket of the mold. Upon hardening, the encapsulant material forms the lower half of the package. The lower and side surfaces of the die pad and leads of the leadframe are covered by molded encapsulant material. The upper surfaces of the die pad and leads are exposed. The reentrant portion and asperities of the side surfaces of the die pad and leads engage the encapsulate material, and prevent the die pad and leads from being pulled from the molded package base.

Step 3 places and attaches an optical integrated circuit device on the exposed upper surface of the die pad. Step 4 electrically connects individual metal bonding pads on the optical device to individual leads of the leadframe. Step 5 applies a bead of a viscous adhesive material, such as epoxy, around the optical integrated circuit device. The bead covers and adheres to a portion of the exposed upper surface of each of the radiating leads. The location of the bead may vary. For example, the bead may be a distance from the optical integrated circuit device, or alternatively may contact the upper surface of the die pad and the side surfaces of the optical device. In another alternative embodiments, the bead covers the die pad, the side surfaces of the optical device, and a peripheral portion of the upper surface of the optical device.

Step 6 provides an optically clear planar cover. The side surfaces of the cover include locking features, such as an indentation or protrusion, that enhance the connection of the cover to the bead. Alternately, the surface of the optically clear cover that faces the bead includes locking features, such as a groove, located where the bead meets the cover to enhance the connection between the cover and the bead.

Step 7 squarely places the cover on the still-viscous bead so that the cover is centered over the integrated circuit device, and presses the cover into the bead. The bead material supports the cover above the bond wires and optical device. Step 8 hardens the bead. Step 9 is a debar and dejunk step, wherein the dam bar and flash are removed. Step 10 trims and forms the leads. This step removes the tie bar. The leads may be plated before Step 9, or pre-plated leads may be used. The leads may be formed into a variety of conventional styles, such as gull wing, through hole, or PLCC styles.

The packages and methods of the present invention have significant cost advantages over the prior art. These and other advantages will become clear through the following detailed discussion.

DETAILED DISCUSSION

Figure 1:
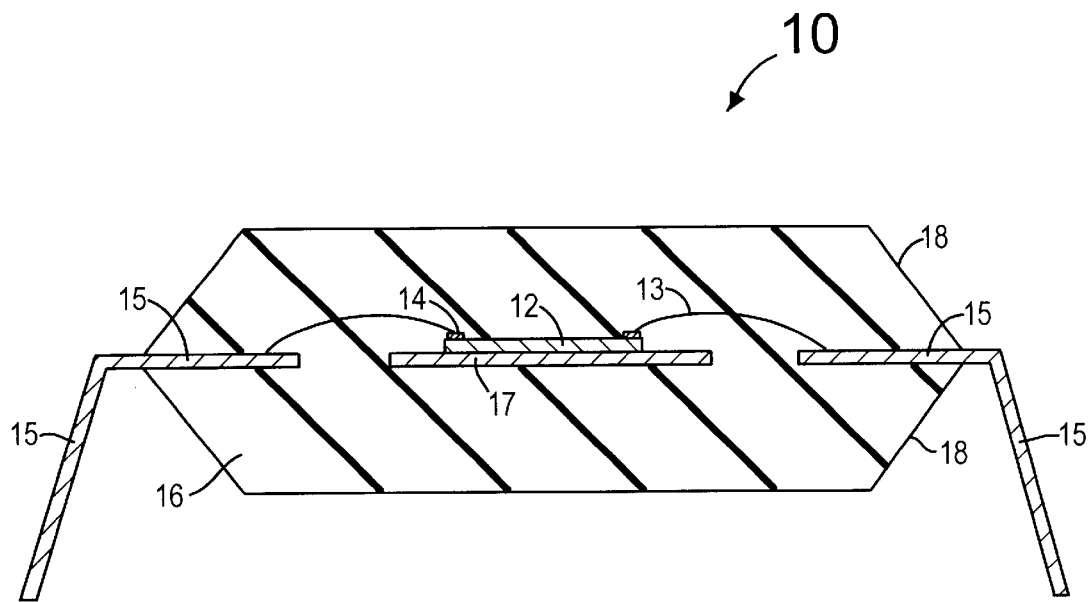
FIG. 1 is a cross-sectional side view of a conventional molded p-dip package.
Figure 2:
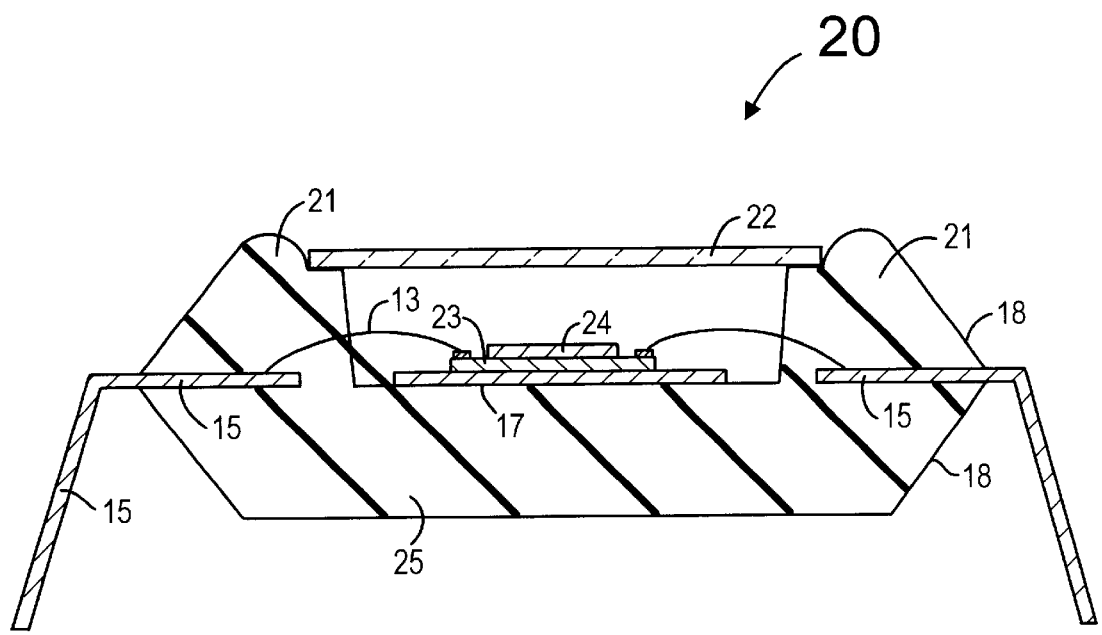
FIG. 2 is a cross-sectional side view of a conventional molded p-dip package for an optical integrated circuit device.
Figure 3:
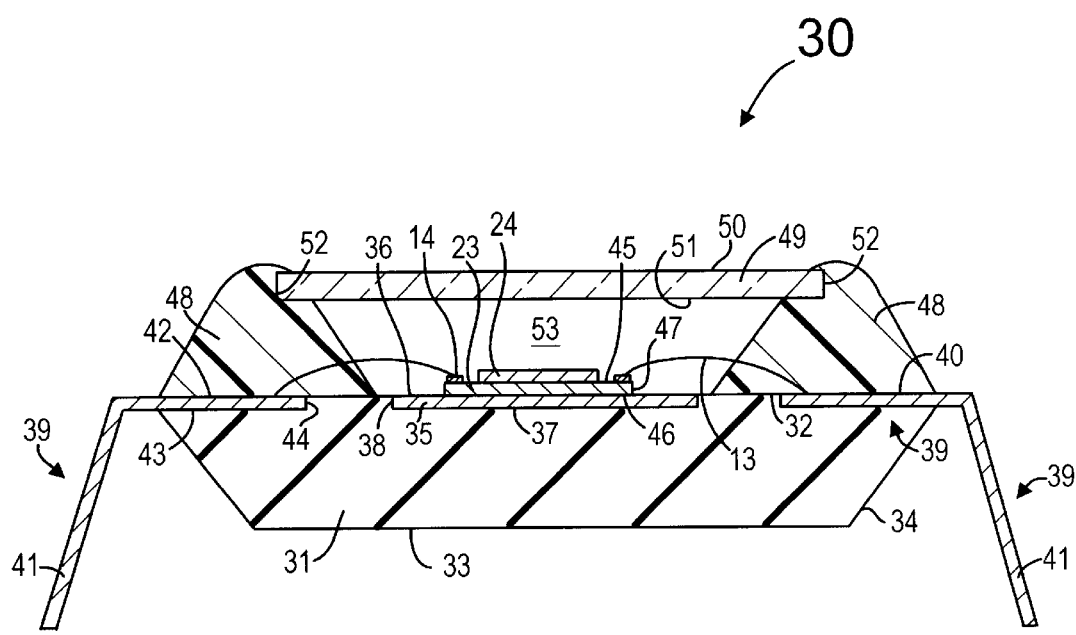
FIG. 3 is a cross-sectional side view of a package for an optical integrated circuit device.

FIG. 3 shows a package 30 in accordance with the present invention. Package 3 includes a molded package base 31. Base 31 is formed of a commercially available insulative molding compound, such as SUMITOMO 6300H, a high stress compound from the Sumitomo Company of Japan. Alternative compounds include NITTO MP-8000AN plastic molding compound from the Nitto Company of Japan, or EME 7351 UT plastic molding compound from the Sumitomo Company.

Molded base 31 of FIG. 3 includes a substantially planar upper first surface 32 (see FIG. 10 also), an opposite substantially planar lower second surface 33, and tapered peripheral side surfaces 34 between first surface 32 and second surface 33.

Embedded in base 31 of FIG. 3 at first surface 32 is a rectangular metal die pad 35. Die pad 35 has a planar or substantially planar upper first surface 36, an opposite planar or substantially planar lower second surface 37, and a side surfaces 38 between first surface 36 and second surface 37. The perimeter shape of die pad 35 may vary. Second surface 37 and side surfaces 38 of die pad 35 are covered by the plastic molding material that forms base 31. First surface 36 of die pad 35 is exposed, i.e., not covered by the plastic molding material.

A plurality of metal leads 39 also are embedded in base 31 at first surface 32 of base 31. A first portion 40 (FIG. 10) of each lead 39 is internal to package 30 and is in the same horizontal plane as die pad 35. A second portion 41 (FIG. 10) of each lead 39 extends beyond sides 38 of base 31 and ultimately is bent into a through-hole configuration (FIG. 3). In alternative embodiments, leads 39 may be formed into any conventional package style, including PLCC and gull wing styles.

Figure 10:
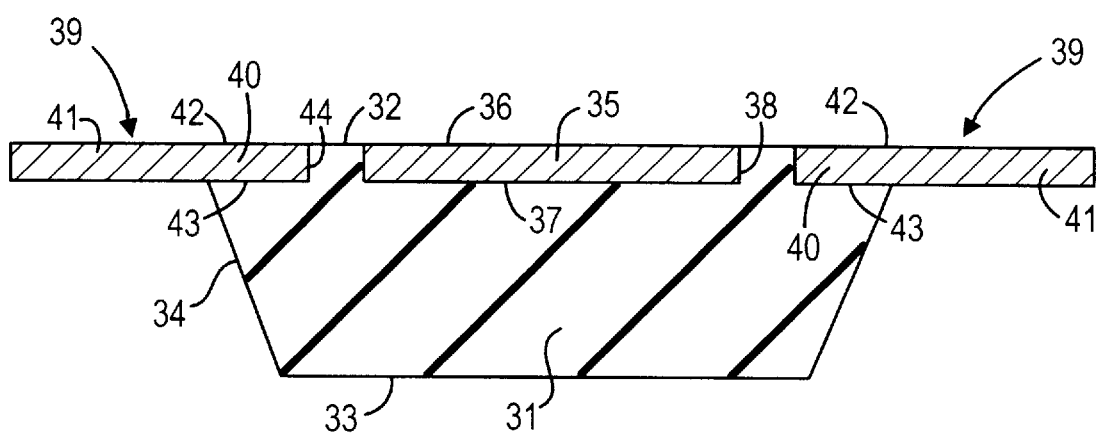
FIG. 10 is a cross-sectional side view of an incomplete package after encapsulant material is molded beneath and on the side surfaces of the leadframe.

Each lead 39 of FIGS. 3 and 10 includes a planar or substantially planar upper first surface 42, an opposite planar or substantially planar second surface 43, and side surfaces 44 between first surface 42 and second surface 43. Second surface 43 and side surfaces 44 of first portion 40 of leads 39 are covered by the plastic molding compound that forms base 31. First surface 42 of first portion 40 of leads 39 is exposed, i.e., not covered by plastic molding compound.

Optical integrated circuit device 23 is centrally placed on and attached to first surface 36 of die pad 35. Exemplary optical integrated circuit devices are EPROMs, CCDs, and camera devices. Optical device 23 has an upper first surface 45, an opposite lower second surface 46, and orthogonal side surfaces 47 between first surface 45 and second surface 46. Second surface 46 of optical device 23 is on first surface 36 of die pad 35. Light sensitive cell 24 is on first surface 45 of optical device 23. Each of a plurality of metal bonding pads 14 at the perimeter of upper first surface 45 of device 23 is connected by a gold bond wire 13 to a first surface 42 of a first portion 40 of a lead 39.

Figure 11:
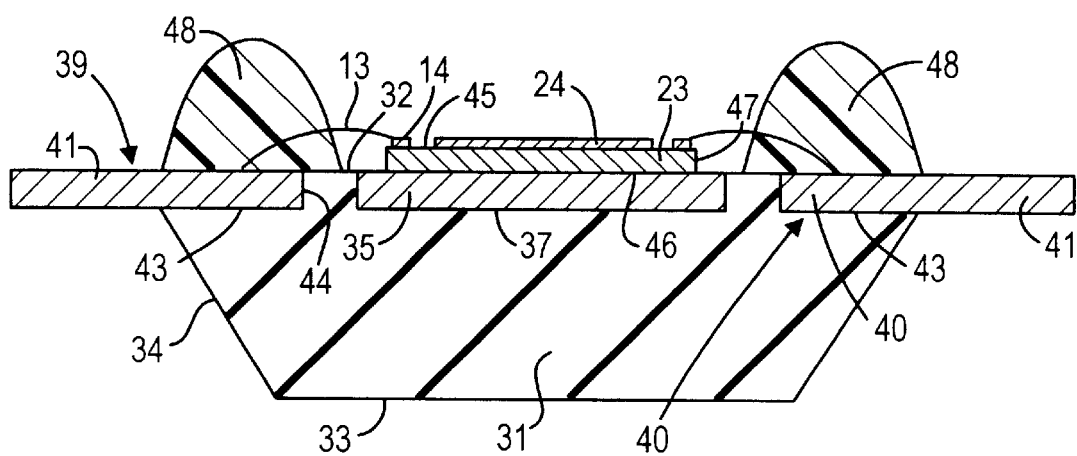
FIG. 11 is a cross-sectional side view of an incomplete package after an adhesive bead is applied around the optical integrated circuit device.

Adjacent to and surrounding optical device 23 of FIG. 3 and FIG. 11 is an adhesive bead 48. Bead 48 is completely around device 23 and is spaced apart from and does not contact optical device 23. Adhesive beads for integrated circuit packages also are described in U.S. patent application Ser. No. 08/844,536 (filed Apr. 18, 1997) (now U.S. Pat. No. 6,034,429) and Ser. No. 09/050,666 filed (Mar. 30, 1998) (now U.S. Pat. No. 6,117,705), which are incorporated herein by reference in their entirety. An example material for bead 48 is HYSOL 4451 epoxy, which is available from the Dexter/Hysol Corp. of City of Industry, CA.

Adhesive bead 48 of FIG. 3 is applied in a viscous state onto upper first surface 32 of base 31 around optical device 23. In particular, bead 48 covers the exposed upper first surface 42 of first portion 40 of leads 39. Bead 48 extends to a height above first surface 32 of base 31 that is greater than the heights of device 23 and bond wires 13.

An optically clear cover 49 forms the top of package 30 of FIG. 3. Cover 49 has a planar first surface 50, an opposite planar second surface 51, and orthogonal peripheral side surfaces 52 between first surface 50 and second surface 51. Cover 49 has a rectangular perimeter in this embodiment, but the perimeter shape and area of cover 49 may vary to match the perimeter shape of bead 48, which also may vary.

Second surface 51 of cover 49 is squarely and centrally placed onto viscous bead 48, and then pressed into bead 48 so that cover 49 is in a press-fitted interconnection with bead 48. The material of bead 48 covers a peripheral portion of lower second surface 51 of cover 49, side surfaces 52 of cover 49 around the entire perimeter of cover 49, and a peripheral portion of upper first surface 50 of cover 49. Bead 48 is then hardened.

Referring to FIG. 3, bead 48 supports cover 49 above upper first surface 45 of device 23, bond wires 13, and upper first surface 32 of base 31. For example, bead 48 may support cover 49 a distance in the range of about 0.3 to 0.5 mm above upper first surface 32 of base 31. Obviously, the dimensions of the elements of package 3 of FIG. 3 vary depending on the application. For example, larger optical devices 23 require larger packages.

Optical device 23 of FIG. 3 is located within a closed cavity 53 that is created by and bounded by upper first surface 32 of base 31, bead 48 around optical device 23, and lower second surface 51 of cover 49.

Figure 4:
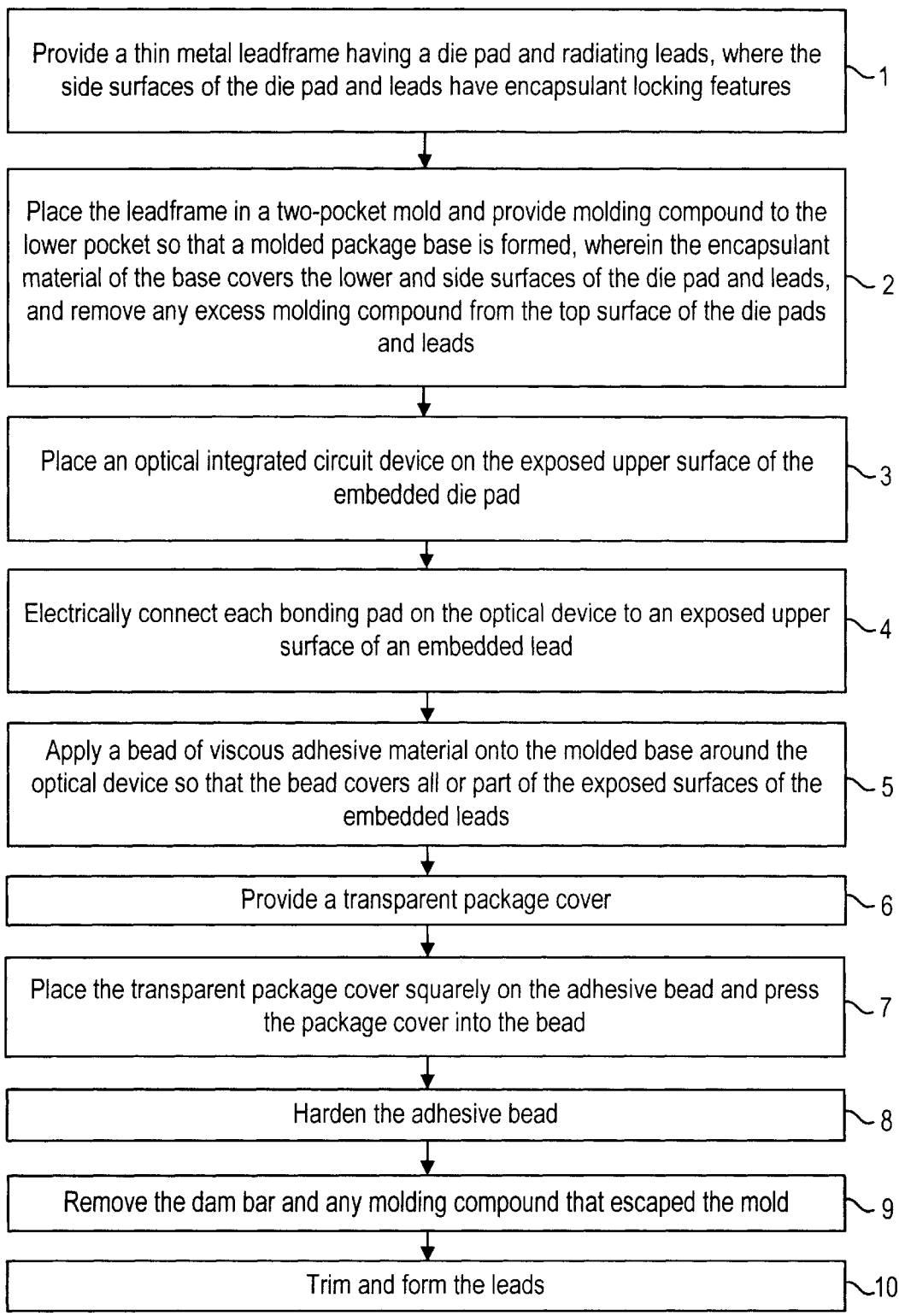
FIG. 4 is a flow chart of a method of making a package for an optical integrated circuit device.

FIG. 4 is a flow chart showing one embodiment of a method within the present invention for making a package like the example shown in FIG. 3. Step 1 of FIG. 4 provides a thin metal leadframe having encapsulant locking features on the side surfaces of the die pad and leads of the leadframe.

Figure 5:
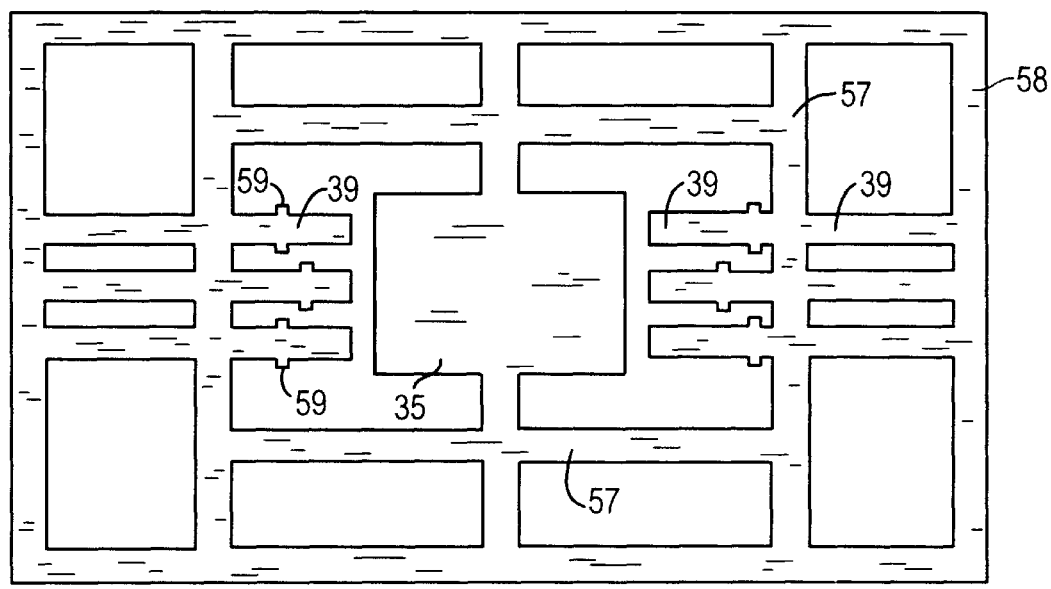
FIG. 5 is a plan view of a leadframe.

FIG. 5 is a plan view of a leadframe 56 within the present invention for making package 30 of FIG. 3. Shading is used in FIG. 5 to identify the metal of leadframe 56. The actual pattern of a leadframe for making a package 30 within the present invention varies with the application, so the pattern of leadframe 56 is exemplary only. Alternatively, leadframes for multiple packages may be formed from a single sheet of metal, and the multiple packages can be formed in parallel.

Leadframe 56 is made of a conventional leadframe metal, such as copper or copper alloys, plated copper or plated copper alloys, Alloy 42 (42% nickel, 58% iron), or copper plated steel, depending on the application. The surfaces of leads 39 to which bond wires are attached may be plated with silver, gold, nickel palladium, or copper, depending on the application.

Leadframe 56 of FIG. 5 includes a central die pad 35 and radiating leads 39. A dam bar 57 and a tie bar 58 interconnect leads 39. Staggered anchor ears 59 extend perpendicularly from the lateral side surfaces 44 of first portion 40 of leads 39. In a completed package, anchor ears 59 prevent leads 39 from being pulled horizontally from package base 31. Alternatively, holes may be formed in leads 39 instead of having anchor ears.

Leadframe 56 of FIG. 5 is identical to conventional leadframes, except for side surfaces 38 of die pad 35 and side surfaces 44 of leads 39. Whereas the side surfaces of the die pad and leads of a conventional leadframe are orthogonal, side surfaces 38 and 44 of FIGS. 3 5–9 have locking features to ensure a secure connection between die pad 35 and leads 39 and the plastic molding compound that forms package base 31 of FIG. 3. As discussed above, side surfaces 38 and 44 are covered by the plastic molding compound which forms base 31 of FIG. 3.

FIGS. 6–9 and 20 provide alternative cross-sectional side views of a die pad 35 and an exemplary lead 39 of leadframe 56 of FIG. 5 and package 30 of FIG. 3. As shown, the die pad and leads of FIGS. 6–9 and 20 have locking features that prevent the die pad and leads from being pulled vertically from molded base 31 of FIG. 3.

Figure 6:
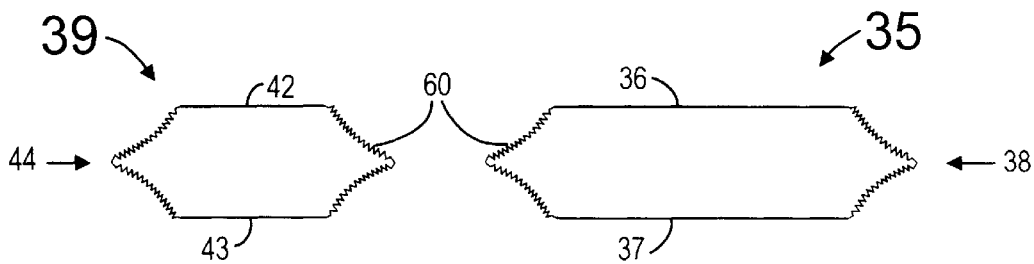
FIG. 6 is a cross-sectional view of a die pad and lead of the leadframe of FIG. 5 showing encapsulant locking features.

In FIG. 6, side surfaces 38 of die pad 35 and side surfaces 44 of lead 39 have reentrant portions. In particular, the upper and lower portions of side surfaces 38 and 44 are reentrant such that there is a protruding central peak 60 between the reentrant portions. Molding compound flows into the reentrant portions of side surfaces 38 and 44. Accordingly, the reentrant portions of side surfaces 38 of die pad 35 and side surfaces 44 of leads 39 of FIG. 6 enhance the connection between the molding compound of base 31 of FIG. 3 and die pad 35 and leads 39.

In addition to having reentrant portions, side surfaces 38 of die pad 35 and side surfaces 44 of lead 39 of FIG. 6 have a roughly-textured surface that includes numerous asperities. Molding compound flows into the areas of the asperities. The asperities also enhance the connection between the molding compound that forms package base 31 of package 30 of FIG. 3 and die pad 35 and the leads 39 of package 30.

Figure 7:
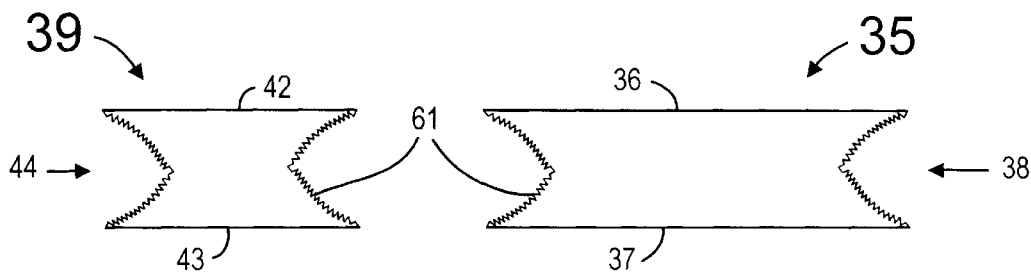
FIG. 7 is a cross-sectional view of a second embodiment of the die pad and leads of the leadframe of FIG. 5.

FIG. 7 shows an alternative profile for side surfaces 38 of die pad 35 and side surfaces 44 of leads 39 of leadframe 56 of FIG. 5 and package 30 of FIG. 3. In FIG. 7, side surfaces 38 and 44 each have a reentrant central depression 61 and a roughly-textured surface that includes numerous asperities. Molding compound flows into central depression 61 and into the areas of the asperities. The reentrant portion and asperities of side surfaces 38 and 44 of FIG. 7 enhance the connection between the molding compound of package base 31 of FIG. 3 and die pad 35 and the leads 39.

Figure 8:
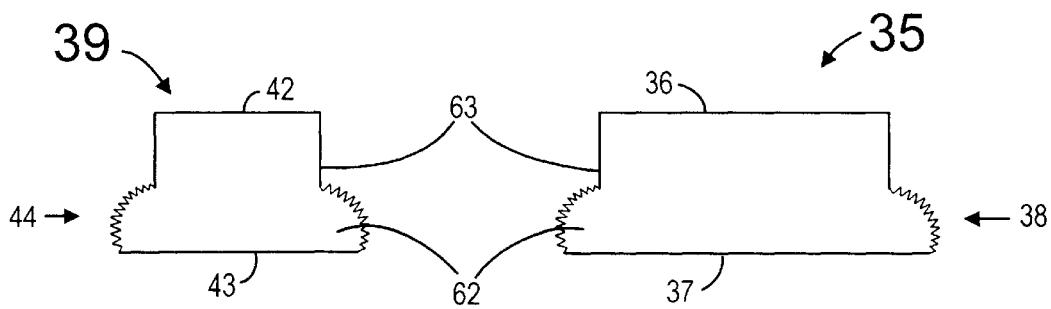
FIG. 8 is a cross-sectional view of third embodiment of the die pad and leads of the leadframe of FIG. 5.

FIG. 8 shows an alternative profile for side surfaces 38 of die pad 35 and side surfaces 44 of leads 39 of leadframe 56 of FIG. 5 and package 30 of FIG. 3. In the embodiment of FIG. 8, side surfaces 38 and 44 include a protruding, rounded lip 62 adjacent to lower second surfaces 37 and 43 of die pad 35 and lead 39, respectively. Lip 62 has a roughly-textured surface which includes numerous asperities. Side surfaces 38 and 44 also have a reentrant orthogonal portion 63 between lip 62 and upper first surfaces 36 and 42 of die pad 35 and leads 39, respectively. Molding compound flows around lip 62 and contacts orthogonal portion 63. Molding compound material also flows into the asperities. Like the embodiments of FIGS. 6 and 7, the reentrant portion and asperities of side surfaces 38 of die pad 35 and side surfaces 44 of lead 39 of FIG. 8 enhance the connection between the molding compound of molded base 31 of package 30 of FIG. 3 and die pad 35 and the leads 39 of package 30.

Figure 9:
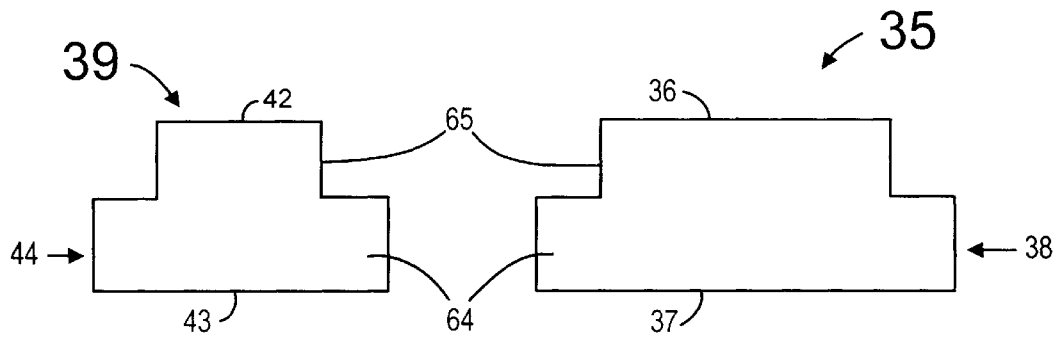
FIG. 9 is a cross-sectional view of fourth embodiment of the die pad and leads of the leadframe of FIG. 5.

FIG. 9 shows an alternative profile for side surfaces 38 of die pad 35 and side surfaces 44 of leads 39 of leadframe 56 of FIG. 5 and package 30 of FIG. 3. In this embodiment, side surfaces 38 and 44 each include a protruding rectangular lip 64 adjacent to lower second surfaces 37 and 43 of die pad 35 and lead 39, respectively. Side surfaces 38 and 44 also have a reentrant orthogonal portion 65 between lip 64 and upper first surfaces 36 and 42 of die pad 35 and lead 39, respectively. Molding compound flows around lip 64 and contacts orthogonal portion 65. Like the embodiment of FIG. 8, the reentrant portion of side surfaces 38 of die pad 35 and side surfaces 44 of lead 39 of FIG. 9 enhance the connection between the molding compound of molded base 31 of FIG. 3 and die pad 35 and the leads 39 of package 30.

Leadframe 56 of FIG. 5 is formed from rolled strip metal stock by wet chemical etching or mechanical stamping using progressive dies. As is well known, chemical etching (also known as chemical milling) is a process that uses photolithography and metal-dissolving chemicals to etch a pattern into a metal strip. The photoresist is exposed to ultraviolet light through a photo mask having a desired pattern, and is subsequently developed and cured. Metal dissolving chemicals are sprayed on or otherwise applied to the masked strip, and exposed portions of the strip are etched away, leaving the desired pattern. As is also well known, progressive stamping uses a set of progressive dies to mechanically remove metal from a metal strip. Each of a plurality of stamping stations uses one of the dies to punch a distinct small area of metal from the strip as the strip moves through the stations. The combined work of the dies produces the desired pattern of the leadframe.

A leadframe 56 (FIG. 5) having side surfaces 38 and 44 of FIG. 6 can be formed by chemically etching the rolled strip metal stock from both sides using a conventional liquid etchant. The etch process is stopped early so that there is an underetching of all of the side surfaces of the components of leadframe 56, including side surfaces 38 of die pad 35 and side surfaces 44 of leads 39, compared to the time it would take to form orthogonal side surfaces. The size and shape of central peak 60 of FIG. 6 is controlled by the amount of underetching. The wet etching also creates the asperities.

A leadframe 56 (FIG. 5) having side surfaces 38 and 44 of FIG. 7 can be formed by chemically etching the rolled strip metal stock from one side using a conventional liquid etchant. The etch process is continued beyond the time required to form orthogonal side surfaces for the components of leadframe 56, i.e., there is an overetching. The size and shape of central depression 61 of FIG. 7 is controlled by the amount of overetching. The etching also creates the asperities.

A leadframe 56 (FIG. 5) having side surfaces 38 and 44 of FIG. 8 can be formed in a two step process. The first step of such a process involves forming a leadframe 56 by chemical etching or progressive stamping so that the side surfaces of the components of leadframe 56, including side surfaces 38 of die pad 35 and side surfaces 44 of leads 39, have an orthogonal profile. The second step involves coining the lower surface of the leadframe 56, i.e., applying a high pressure impact to the lower surface of the leadframe 56. This coining step deforms the side surfaces of leadframe 40 adjacent to the impacted surface so that the rounded, asperity-marked protruding lips 62 of FIG. 8 are formed.

A leadframe 56 (FIG. 5) having side surfaces 38 and 44 of FIG. 9 can be formed by progressive stamping. The side surfaces of the components of leadframe 56, including side surfaces 38 of die pad 35 and the side surfaces 44 of leads 39, can be provided with a rectangular lip 64 and a reentrant orthogonal portion 65 by including intermediate stamping steps which do not fully cut through the rolled strip metal stock before finally cutting through the rolled strip sheet. The intermediate stamping steps and the final cutting steps combine to form the rectangular, protruding lips 64 of side surfaces 38 and 44 of FIG. 9.

Step 2 of FIG. 4 places leadframe 56 in a mold having two pockets for making conventional p-dip packages. In accordance with the present invention, the upper pocket of the mold above leadframe 56 is blanked out by a pocket bar so that encapsulant material does not enter the upper pocket and does not cover the upper surface of leadframe 56. During the molding process, molding compound only enters the lower pocket of the mold. A commercially available, high stress molding compound by Sumitomo Company of Japan, SUMITOMO 6300H, is usable. Other standard encapsulant materials, such as NITTO MP-8000AN molding compound from the Nitto Company of Japan, and EME 7351 UT molding compound from the Sumitomo Company of Japan also can be used.

FIG. 10 is a cross-sectional side view of an incomplete package after Step 2 of FIG. 4. Step 2 forms package base 31, as shown in FIGS. 3 and 10. Molding compound is molded beneath and on the lower and side surfaces of the central portion of leadframe 56.

Referring to FIGS. 3, 6–9 and 20, Step 2 of FIG. 4 is performed so that the molding compound covers lower second surfaces 37 and side surfaces 38 of die pad 35 and lower second surface 43 and side surfaces 44 of leads 39. Accordingly, the reentrant portions and asperities (if any) shown in FIGS. 6–9 and 20 engage the molding compound and lock die pad 35 and leads 39 to base 31 (FIGS. 3 and 10).

Step 2 concludes with a deflash step, wherein any excess molding compound that inadvertently covers first surface 42 of leads 39 or first surface 36 of die pad 35 is removed from first surface 42 of leads 39 and first surface 36 of die pad 35. This may be performed, for example, by directing a high pressure water stream including polypropylene beads at the first surface 42 of leads 39 and first surface 36 of die pad 35.

Referring to FIGS. 3, 5, and 10, Step 3 of FIG. 4 places lower second surface 46 of optical integrated circuit device 23 on the exposed upper first surface 36 of die pad 35 of leadframe 56, and attaches second surface 46 of device 23 to first surface 36 of die pad 35. Step 3 is performed with a conventional device attach machine and adhesive.

Referring to FIG. 3, Step 4 of FIG. 4 electrically connects each bonding pad 14 on optical device 23 to an upper first surface 42 of a first portion 40 of a lead 39. In the embodiment of FIG. 3, conventional gold bond wires 13 are connected between pads 14 and leads 39. Conventional bond wire attachment methods are used.

Referring to FIG. 10, Step 5 of FIG. 4 applies a bead of a viscous adhesive material, such as epoxy, on the upper surfaces of base 31 and leadframe 56 around optical device 23. FIG. 11 shows an adhesive bead 48 on first surface 32 of base 31 and a portion of first surfaces 42 of first portion 40 of leads 39 of leadframe 56.

Although not completely shown by FIG. 11, bead 48 surrounds optical device 23. Bead 48 also covers and adheres to first surface 32 of base 31 and to a portion of the upper first surface 42 of a first portion 40 of each lead 39. First surface 42 and bead 48 form a cavity 53 around and above optical device 23, as indicated in FIG. 3. Cavity 53 ultimately is closed by the placement of cover 49 onto bead 48.

Example dimensions for bead 48 are about 0.5 mm to 0.8 mm in width at base 31, and about 0.8 mm to 1.0 mm in height above base 31. Bead 48 must be sized so that, even in a viscous state, bead 48 will, at least temporarily, support cover 49 above bond wires 13, optical device 23, and base 31. Upon hardening, bead 48 permanently supports cover 49 above bond wires 13, optical device 23, and base 31 (FIG. 3).

Figure 12:
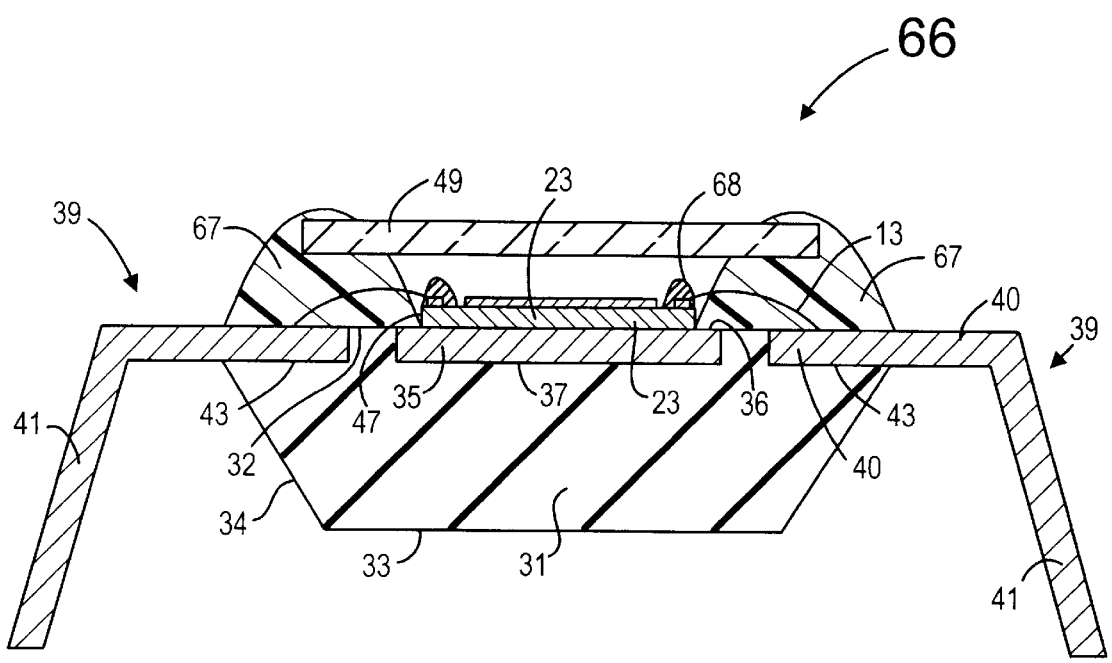
FIG. 12 is a cross-sectional side view of an alternative package where the adhesive bead covers exposed portions of the die pad and the side surfaces of the optical integrated circuit device.

FIG. 12 shows an alternative embodiment of a package within the present invention. Package 66 of FIG. 12 is the same as package 30 of FIG. 3, and is made the same way, except with respect to the location of the adhesive bead around optical device 23. Like bead 48 of FIG. 3, bead 67 of FIG. 12 covers portions of first surface 32 of base 31 and first surface 42 of radiating leads 39. In addition, bead 67 covers an exposed peripheral portion of first surface 36 of die pad 35 around device 23, a portion of side surfaces 47 of optical device 23, and a lower portion of bond wires 13, including the connection between bond wires 13 and leads 39. In FIG. 12, bead 67 does not contact first surface 45 of optical device 23. To prevent corrosion, a dot 68 of the bead material or some other adhesive material or epoxy covers the connection between each bond wire 13 and bonding pad 14.

Figure 12A:
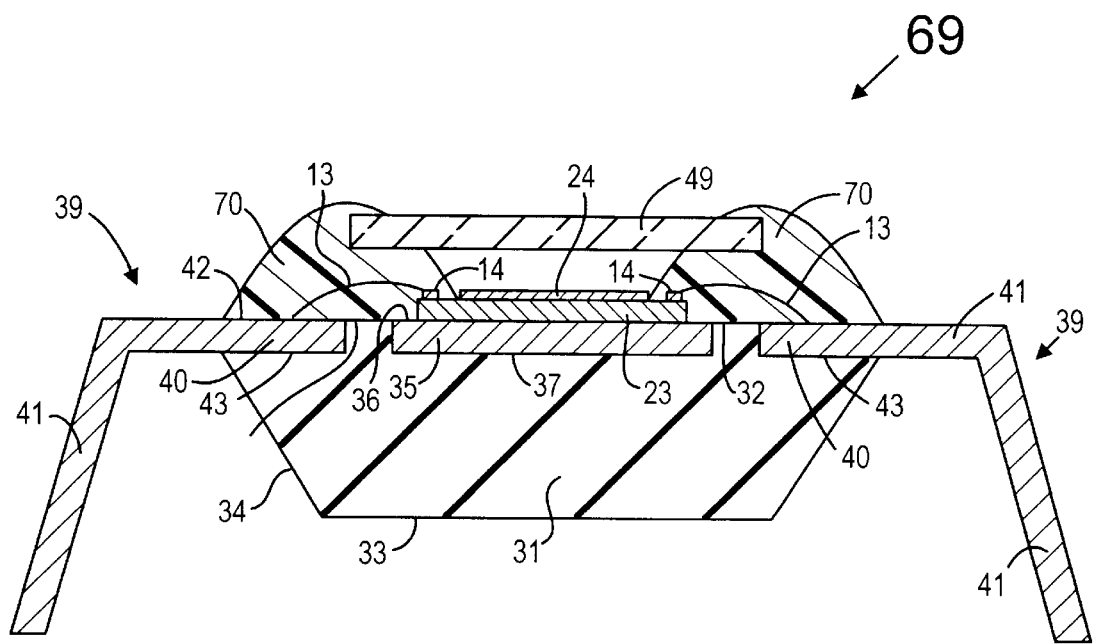
FIG. 12A is a cross-sectional side view of an alternative package where the adhesive bead covers exposed portions of the die pad, and the side surfaces and a peripheral portion of the upper surface of the optical integrated circuit device.

FIG. 12A shows another alternative embodiment of a package within the present invention. Package 69 of FIG. 12A is identical to package 30 of FIG. 3 and package 66 of FIG. 12, and is made the same way, except as to the location of bead 70 around optical device 23. Bead 70 of FIG. 12A covers portions of first surface 32 of base 31 and first surface 42 of leads 39, an exposed peripheral portion of first surface 36 of die pad 35 around optical device 23, the entirety of side surfaces 47 of optical device 23, bond wires 13, and a peripheral portion of upper first surface 45 of optical device 23, including the connection between bonding pads 14 and bond wires 13. Care is taken, however, that bead 70 does not contact optical cell 24 of device 23.

Step 6 of FIG. 4 provides a thin optically clear cover through which light may be transmitted. The size and perimeter shape of the cover should be calculated to match the location and perimeter shape of the adhesive bead around the optical device (FIG. 11A). As shown in FIG. 3, cover 49 is sized so that the area of cover 49 is equal to the area bounded by the mid-point of the width of bead 48. Accordingly, cover 49 may be press-fitted into bead 48 so that side surfaces 52 of cover 49 are covered by bead 48 (FIG. 3).

Example materials for cover 49 of FIG. 3 include glass, such as borosilicate glass. An example thickness of a borosilicate glass cover 49 is about 0.5 mm, but the thickness may vary with the application. Alternatively, cover 49 can be made of any optically clear material, such as polycarbonate, clear plastic or quartz.

Referring to FIG. 3, Step 7 of FIG. 4 places optically clear cover 49 onto the still-viscous bead 48, so that a peripheral portion of and all around second surface 51 of cover 49 contacts the top of bead 48 all around cover 49 and optical device 23. Next, cover 49 is pressed by gravity or the application of force into bead 48, so that the entire height of side surfaces 52 and a peripheral portion of and all around first surface 50 of cover 49 is covered by bead 48. In FIG. 3, cover 49 is in a press-fitted interconnection with bead 48. Step 7 closes cavity 53.

Step 7 may be performed by hand, by a conventional pick and place machine, or with the modified pick and place machine described in U.S. patent application Ser. No. 08/844,536, (now U.S. Pat. No. 6,034,429) which was filed on Apr. 18, 1997 and is incorporated herein by reference.

In an alternative embodiment (not shown), cover 49 is pressed a lesser distance into bead 48. In such an embodiment, all or just the lower part of the height of side surfaces 52 is press-fitted into bead 48, and bead 48 does not contact first surface 50 of cover 49.

Step 8 of FIG. 4 hardens bead 48. Where bead 48 is an epoxy, Step 8 is performed by heating package 30 and bead 48 at about 150 degrees Celsius for approximately one hour. Upon hardening, bead 48 supports cover 49 above optical device 23 and attaches cover 49 to base 31 of package 30 of FIG. 3.

Step 9 is a debar and dejunk step. In Step 9, excess molding compound that squirts out between the mold halves is removed. The dam bar 57 (FIG. 5) also is removed. Conventional methods using conventional automated equipment are used.

Step 10 of FIG. 4 trims and forms leads 39 of package 30 of FIG. 3 in a conventional manner. In this step, tie bar 58 is removed and the leads 39 are bent and cut into a selected configuration. The leads 39 may be plated before Step 10, if the leads 39 are not already plated. The leads 39 may be formed into a variety of conventional styles, such as gull wing, through hole, or PLCC styles.

As shown in FIG. 3, side surfaces 52 of cover 49 are orthogonal. Alternatively, the side surfaces of the optically clear cover may include locking features that enhance the connection between the optically clear package cover and adhesive bead 48 around optical device 23.

FIGS. 13–17 show alternative optically clear package covers 71, 75, 77, 81 and 85, respectively, for package 30 of FIG. 3. The side surfaces of each cover in FIGS. 13–17 include a reentrant portion(s) as a locking feature for enhancing the connection between the optically clear cover and bead 48 and package 30 of FIG. 3. To simplify the drawings, only the alternative covers and bead 48 of package 30 are shown in FIGS. 13–17. The remainder of package 30 of FIG. 3 is omitted.

Figure 13:
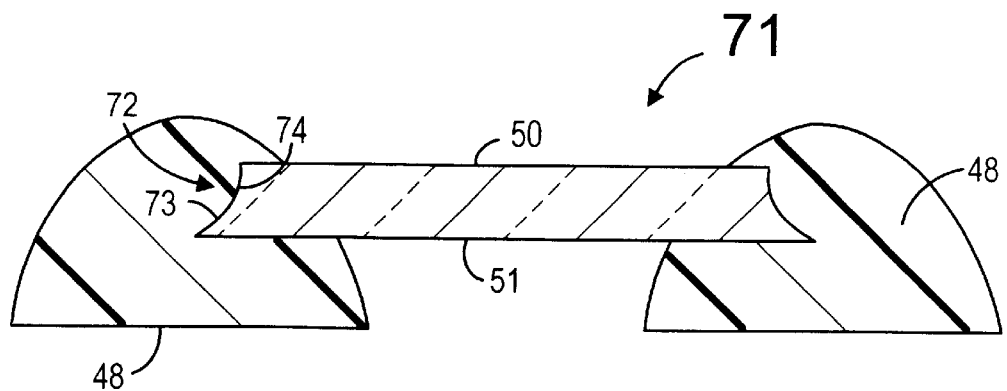
FIG. 13 is a cross-sectional side view of a first alternative optically clear cover for the package of FIG. 3 wherein the side surfaces of the cover include an arced surface.
Figure 14:
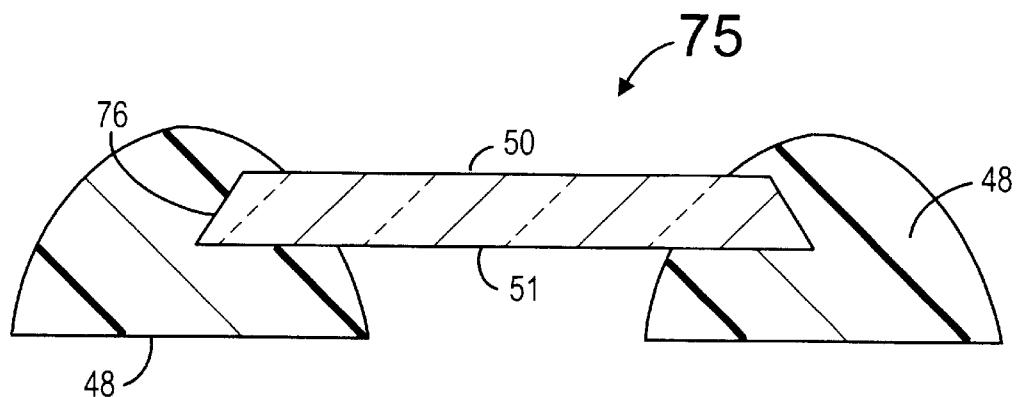
FIG. 14 is a cross-sectional side view of a second alternative optically clear cover for the package of FIG. 3 wherein the side surfaces of the cover have a diagonal orientation relative to a planar first surface of the aperture cover.

FIG. 13 is a cross-sectional side view of a first alternative optically clear cover 71 for package 30 of FIG. 3. Cover 71 includes a side surface 72 between upper first surface 50 and lower second surface 51. Beginning at second surface 51, side surface 72 of cover 71 includes a protruding arced portion 73. Between arced portion 73 and first surface 50 is an orthogonal portion 74. Bead 48 covers protruding portion 73 and applies downward force on protruding portion 73, which locks cover 71 to bead 48 and package 30. Bead 48 also contacts orthogonal portion 74. Side surface 72 may be formed by cutting cover 71 from a sheet of glass or other optically clear material using a rounded saw blade FIG. 14 is a cross-sectional side view of a second alternative optically clear cover 75 for package 30 of FIG. 3.

Cover 75 includes a side surface 76 between upper first surface 50 and lower second surface 51. Side surface 76 is flat and has a diagonal orientation relative to first surface 50 and second surface 51. Side surface 76 slopes laterally inward from second surface 51 toward first surface 50 of cover 75. Bead 48 covers all or part of side surface 76 and applies downward force on side surface 76, which locks cover 75 to bead 48 and package 30. Side surface 76 may be formed by cutting cover 75 from a sheet of glass or other optically clear material using a wedge-shaped saw blade.

Figure 15:
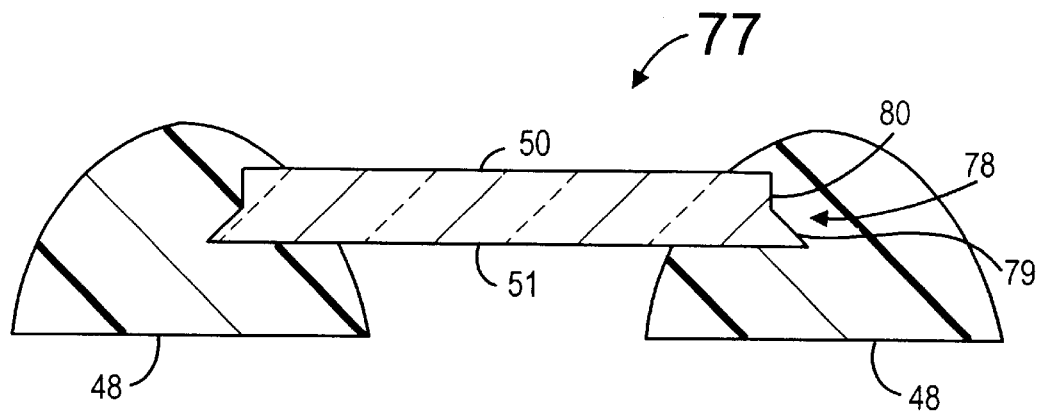
FIG. 15 is a cross-sectional side view of a third alternative optically clear cover for the package of FIG. 3 wherein the side surfaces of the cover have a diagonal portion and an orthogonal portion.

FIG. 15 is a cross-sectional side view of a third alternative optically clear cover 77 for package 30 of FIG. 3. Beginning adjacent to second surface 51, side surface 78 of cover 77 includes a protruding diagonal portion 79 that slopes laterally inward from second surface 51 towards first surface 50. Beginning at about a midpoint of side surface 78, between diagonal portion 79 and first surface 50, is an orthogonal portion 80. Bead 48 covers diagonal portion 79 of side surface 78 and applies downward force on side surface 78, which locks cover 77 to bead 48 and package 30. Side surface 78 may be formed by cutting cover 77 from a sheet of glass or other optically clear material using a saw blade having a wedge-shaped tip and an orthogonal portion above the tip.

Figure 16:
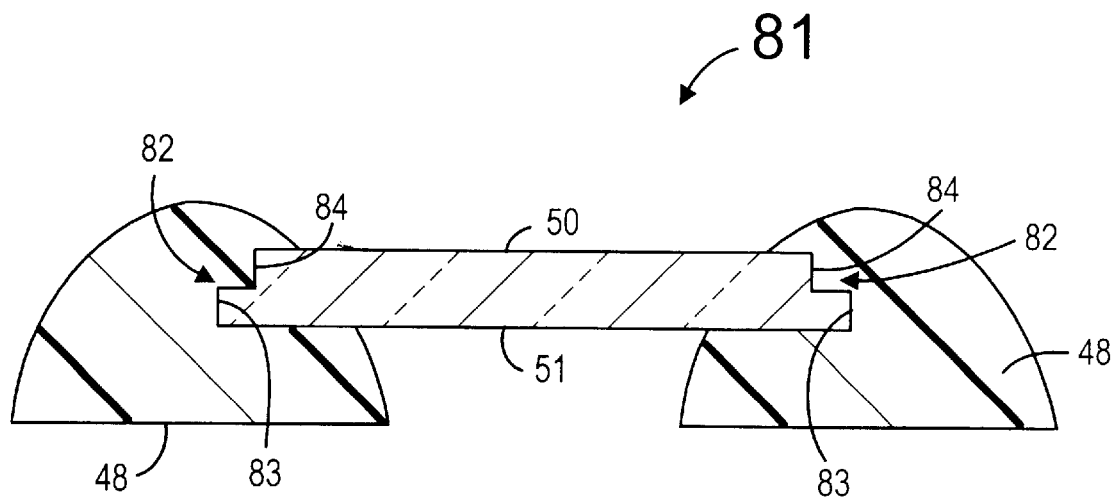
FIG. 16 is a cross-sectional side view of a fourth alternative optically clear cover for the package of FIG. 3 wherein the side surfaces of the cover include a rectangular lip and a recessed orthogonal portion.

FIG. 16 is a cross-sectional side view of a fourth alternative optically clear cover 81 for package 30 of FIG. 3. Beginning adjacent to second surface 51, side surface 82 of cover 81 includes a protruding rectangular lip 83. Between lip 83 and first surface 50 is an orthogonal portion 84. Bead 48 covers lip 83, contacts orthogonal portion 84, and applies downward force on side surface 82, which locks cover 81 to bead 48 and package 30. Side surface 82 may be formed using a step-cut saw blade.

Figure 17:
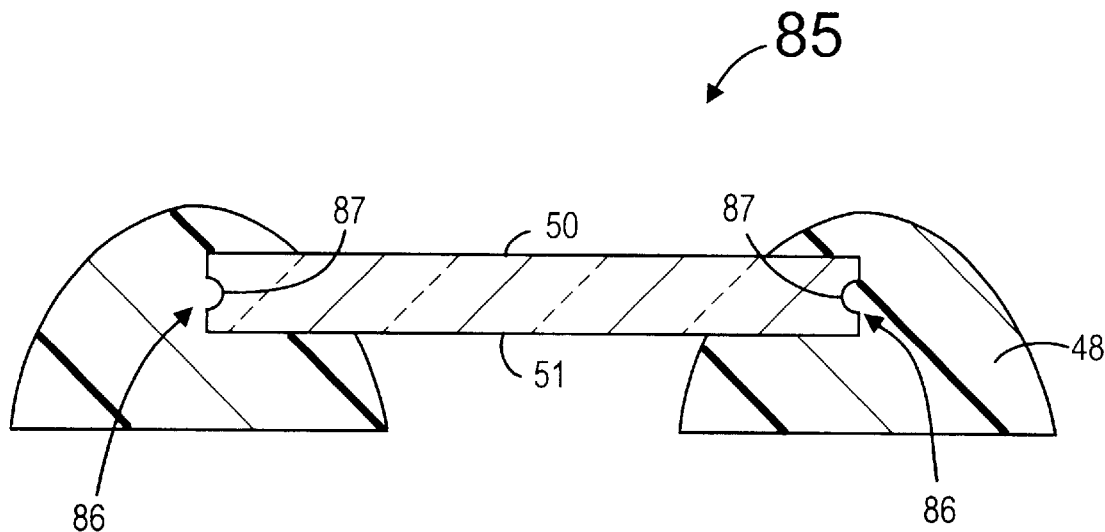
FIG. 17 is a cross-sectional side view of a fifth alternative optically clear cover for the package of FIG. 3 wherein the side surfaces of the cover include an arc-shaped indentation.

FIG. 17 is a cross-sectional side view of a fifth alternative optically clear cover 85 for package 30 of FIG. 3. Cover 85 has a side surface 86. On side surface 86, near second surface 51 of cover 85, is an 180 degree arc-shaped indentation 87. The remainder of side surface 86 is orthogonal. Bead 48 flows into indentation 87 and applies downward force on cover 85, which locks cover 85 to bead 48 and package 30. Indentation 87 may be formed with a rounded saw blade. Alternatively, such an indentation may have other shapes, such as square or triangular.

Other shapes for the optically clear covers of the packages of the present invention may be adapted from those disclosed in U.S. patent application Ser. No. 09/118,197, (now U.S. Pat. No. 5,949,655) which was filed on Jul. 17, 1998 and is incorporated in full in the present application by reference.

Figure 18:
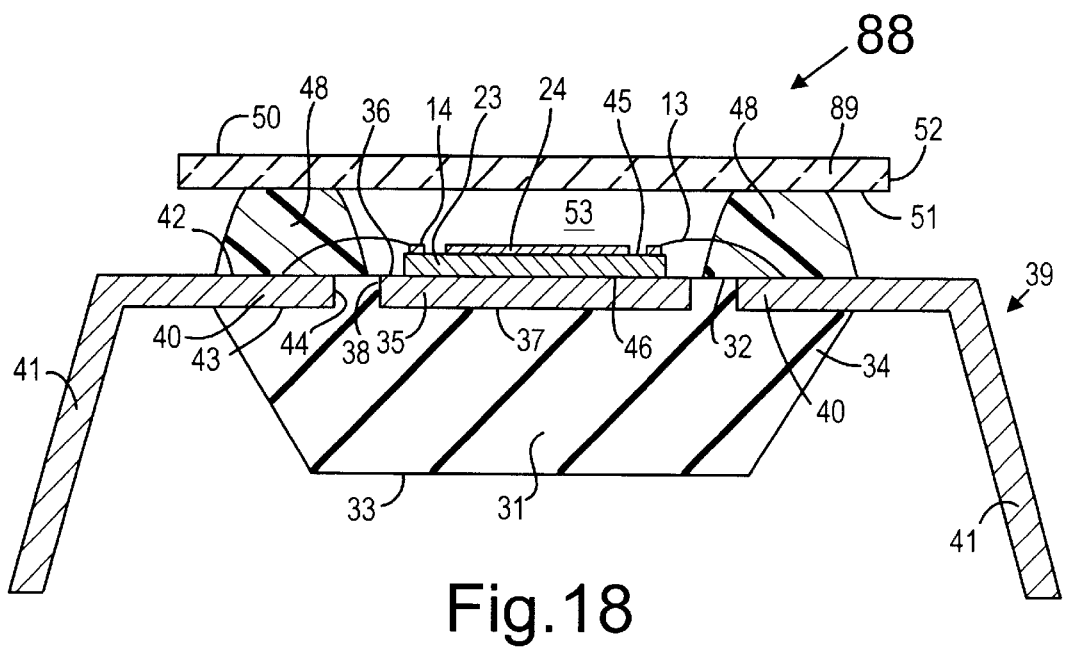
FIG. 18 is a cross-sectional side view of an alternative package where the optically clear cover is on the adhesive bead.

FIG. 18 shows an alternative package 88 within the present invention. Package 88 is identical to package 30 of FIG. 3, and is made the same way, except that the area of optically clear cover 89 is equal to or greater than the area within the outer perimeter of adhesive bead 48. Accordingly, bead 48 contacts and adheres only to lower second surface 51 of cover 89, and does not contact side surfaces 52 or upper first surface 50 of cover 89. In such an embodiment, second surface 51 of cover 89 is on and adhesively connected to bead 48 around optical device 23, but is not press-fitted into bead 48.

Figure 19:
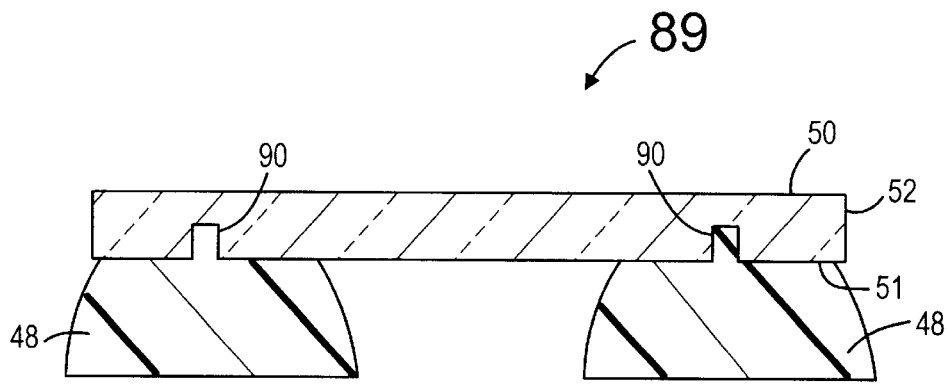
FIG. 19 shows an alternative optically clear cover for the package of FIG. 18 where a groove is cut into the cover where the cover meets the adhesive bead.
Figure 20:
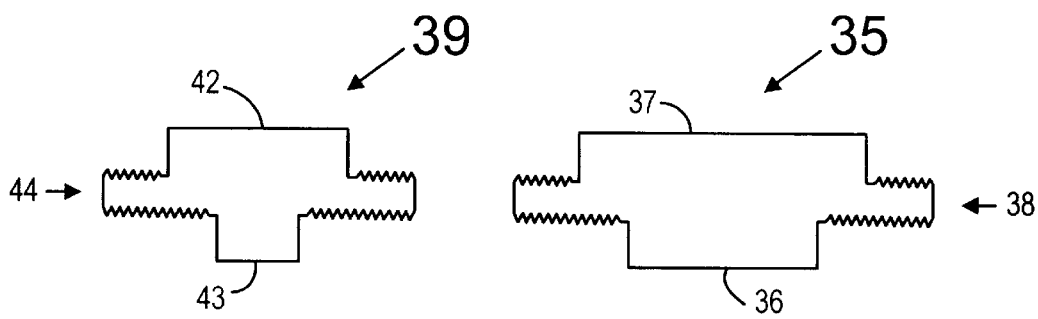
FIG. 20 is a cross-sectional view of a fifth embodiment of a die pad and lead of the leadframe of FIG. 5.

Optionally, an encapsulant locking feature, such as a groove or equivalent, may be formed on or cut into second surface 51 where cover 89 contacts bead 48. FIG. 19 shows an example groove 90 in a cover 89. Groove 90 increases the surface area of cover 89 in contact with bead 48, and thereby strengthens the connection between cover 89 and bead 48 and package 30. Alternatively, groove 90 or an equivalent locking feature on second surface 51 may be combined with one of the side surface locking features of FIGS. 13–17.

Similar to FIGS. 6–9, FIG. 20 shows a fifth alternative profile of reentrant side surfaces 38 of die pad 35 and reentrant side surfaces 44 of leadframe 56 of FIG. 5 and package 30 of FIG. 3. In this embodiment, side surfaces 38 and 44 each include an approximately rectangular projection 91 as an encapsulant locking feature. Projection 91 is between first surfaces 42 and 36 and second surfaces 43 and 37 of die pad 35 and leads 39. Side surfaces 38 and 44 and projection 91 have asperities. Side surfaces 38 and 44, including projection 91, are formed by chemical etching from both sides of die pad 35 and leads 39 using a mask.

Figure 21:
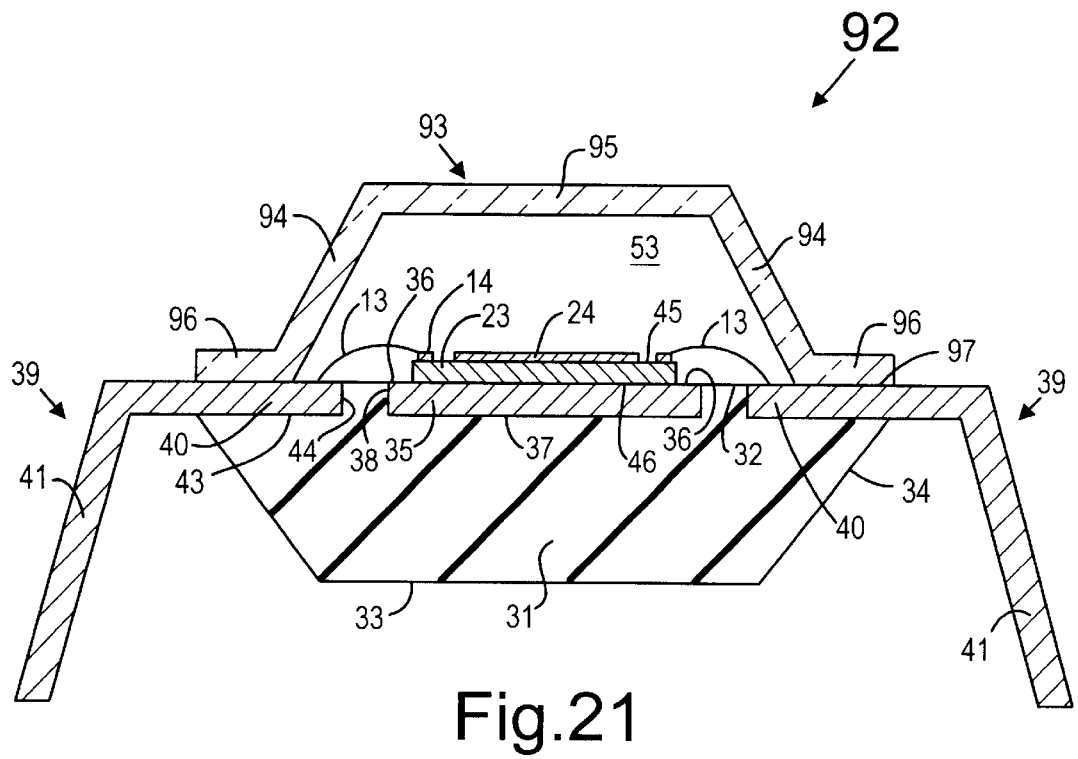
FIG. 21 is a cross-sectional view of an alternative package having a molded cap above and around the optical device.

FIG. 21 is a cross-sectional view of an alternative package 92 within the present invention for optical integrated circuit device 23. Package 92 of FIG. 21 is similar to, but differs from package 30 of FIG. 3 in that, instead of a planar cover 49 and bead 48, a shaped, molded cap 93 encloses optical device 23 above first surface 32 of base 31. Cap 93 is a thin, hollow, approximately cubic structure open at one side that forms a cavity 53 above and around optical device 23. Cap 93 includes four thin, slightly sloped, and approximately rectangular-in-area sidewalls 94 that are joined to a thin, planar, approximately rectangular-in-area upper side 95. (In the cross-sectional view of FIG. 21, only two sidewalls 94 are shown). Cap 93 has an opening opposite to side 95 and adjacent to the foot-like extensions 96 of sidewalls 94. A lower surface 97 of extensions 96 of sidewalls 94 of cap 93 is adhesively joined by epoxy (not shown) to upper first surface 32 of molded base 31 and upper first surface 42 of internal portion 40 of leads 39, forming a tight seal around the perimeter of first surface 32. Epoxy is applied onto first surface 32 of base 31 completely around optical device 23. Cap 93 is then placed onto epoxy 99. Care is taken to ensure cap 93 is squarely placed on upper first surface 32 so that planar upper side 95 of cap 93 is parallel to upper first surface 45 and cell 24 of optical device 23. Cap 93 is injection molded, for example, and is formed of an optically clear material, such as optically clear plastic or polycarbonate. This package embodiment is used, for example, with through hole lead configurations. Of course, other shapes for cap 93 are possible. The key feature is that cap 93 provides an enclosure for device 23.

Figure 22:
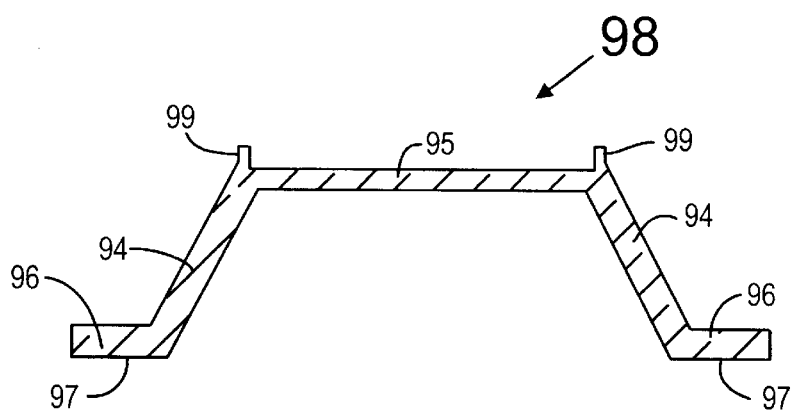
FIG. 22 is an alternative cap for the package of FIG. 21, wherein the cap has an anti-scratch feature.

FIG. 22 shows an alternative, anti-scratch embodiment of a cap for package 92. Cap 98 includes all of the features of cap 93, plus a projection 99 that extends above and around the periphery of upper side 95. Projection 99 prevents scratches on upper side 95 when cap 98 is inverted or something is placed on cap 98.

An alternative method for Step 5 of FIG. 4 is to apply adhesive bead 48 of FIGS. 3 and 11 in two steps. A first step applies the bead on upper surface 32 of base 31 substantially around optical integrated circuit device 23, leaving a small gap or dip in bead 48. After Step 8, the small gap or dip is filled with additional bead material, closing cavity 53. Leaving such a gap or dip in bead 48 allows gases within cavity 53 to escape while bead 48 hardens, and thus prevents cocking of cover 49. A bead material, such as Hysol 4323, which sticks to itself, can be used. This technique is described in U.S. patent application Ser. No. 08/844,536, (now U.S. Pat. No. 6,034,429) which is incorporated by reference. Cap 93 of package 92 of FIG. 22 can be adhered to first surface 32 in the same two step manner.

The embodiments described herein are merely examples of the present invention. Artisans will appreciate that variations are possible within the scope of the claims.

What is claimed is:

1. A package for an integrated circuit device comprising:
a base of molded insulative material having a planar first surface;
a die pad in an embedded connection with said base at the first surface of said base, wherein a first surface of the die pad is not covered by the insulative material of the base;
a plurality of leads, said leads having a first portion in an embedded connection with said base at the first surface of said base, and a second portion extending from said base, wherein a first surface of the first portion of each lead is not covered by the insulative material of the base;
an integrated circuit device having a first surface and an opposite second surface, wherein the first surface of the integrated circuit device includes a light sensitive portion, and the second surface of the integrated circuit device is on the first surface of the die pad;
a bead of a first adhesive material, said bead on the first surface of the base around the integrated circuit device; and
an optically clear package cover having a planar first surface, wherein said first surface of the cover is connected to the adhesive bead around the integrated circuit device and is supported above the first surface of the integrated circuit device by the bead.

2. The package of claim 1, wherein
the die pad has a second surface opposite the first surface of the die pad, and a side surface between said first surface and said second surface, and the second surface and side surface of the die pad are covered by the insulative material of the base;
the first portion of each of said leads has a second surface opposite the first surface of the first portion of the lead, and a side surface between the first surface and the second surface, and the second surface and side surface of the first portion of each lead are covered by the insulative material of the base; and
the side surface of the die pad and the side surface of the first portion of the leads include a reentrant portion in contact with said insulative material of the base.

3. The package of claim 2, wherein the side surface of the die pad and of the first portion of the leads include asperities.

4. The package of claim 2, wherein the side surface of the die pad and of the first portion of the leads include a central peak.

5. The package of claim 2, wherein the side surface of the die pad and of the first portion of the leads include a central depression.

6. The package of claim 1, wherein
the die pad has a second surface opposite the first surface of the die pad, and a side surface between said first surface and said second surface, and the second surface and side surface of the die pad are covered by the insulative material of the base;
the first portion of each of said leads has a second surface opposite the first surface of the first portion of the lead, and a side surface between the first surface and the second surface, and the second surface and side surface of the first portion of each lead are covered by the insulative material of the base; and
the side surface of the die pad includes a means for enhancing the connection between the insulative base and the die pad, and the side surface of the first portion of the leads includes a means for enhancing the connection between the insulative base and the first portion of the leads.

7. The package of claim 1, wherein
said optically clear cover has a planar second surface opposite said first surface, and a side surface between said first surface and said second surface; and
wherein said adhesive bead contacts a peripheral portion of the first surface of the cover and the side surface of the cover.

8. The package of claim 7, wherein said adhesive bead contacts a peripheral portion of the second surface of the cover.

9. The package of claim 7, wherein the side surface of the cover includes a means for enhancing the connection between the cover and the adhesive bead.

10. The package of claim 7, wherein the side surface of the cover includes a reentrant portion in contact with said bead.

11. The package of claim 7, wherein the side surface of the cover includes a protruding arced portion, and the bead contacts said arced portion.

12. The package of claim 7, wherein all or part of the side surface of the cover in contact with said bead has a diagonal orientation relative to the first surface of the cover.

13. The package of claim 7, wherein the side surface of the cover has a first portion beginning at the first surface of the cover in contact with the bead, and a second portion between said first portion and the second surface of the cover, and said first portion has a diagonal orientation relative to the second surface of the cover, and the second portion is orthogonal.

14. The package of claim 7, wherein the side surface of the cover includes an arc-shaped indentation.

15. The cover of claim 7, wherein the side surface of the cover has a first orthogonal portion beginning at the first surface of the cover, and a second orthogonal portion between said first portion and the second surface of the cover, and the second orthogonal portion is recessed from the first orthogonal portion.

16. The package of claim 1, wherein the first surface of the cover includes a means for enhancing the connection between the bead and the cover.

17. The package of claim 1, wherein the first surface of the cover includes a groove in contact with said bead.

18. The package of claim 2, wherein
said optically clear cover has a planar second surface opposite said first surface, and a side surface between said first surface and said second surface;
said adhesive bead contacts a peripheral portion of the first surface of the cover and the side surface of the cover; and
the side surface of the cover includes a reentrant portion in contact with said bead.

19. The package of claim 2, wherein
said optically clear cover has a planar second surface opposite said first surface and a side surface between said first surface and said second surface;
said adhesive bead contacts a peripheral portion of the first surface of the cover and the side surface of the cover; and
the side surface of the cover includes a means for enhancing the connection between the cover and the adhesive bead.

20. The package of claim 2, wherein
said optically clear cover has a planar second surface opposite said first surface wherein the first surface of the cover is in a connection with said bead around the integrated circuit device; and the first surface of the cover includes a means for enhancing the connection between the bead and the cover.

21. The package of claim 20, wherein the package includes a plurality of electrical conductors, with each conductor in a first connection with a bonding pad on said integrated circuit device and a second connection with a first portion of a lead, and the adhesive bead covers said second connection, and a second adhesive material covers said first connection.

22. The package of claim 1, wherein said integrated circuit device has a side surface between the first surface and the second surface of the integrated circuit device; and said adhesive bead contacts the side surface of the integrated circuit device.

23. The package of claim 22, wherein the package includes a plurality of electrical conductors, with each conductor in a first connection with a bonding pad on said integrated circuit device and a second connection with a first portion of a lead, and the adhesive bead covers said second connection, and a second adhesive material covers said first connection.

24. The package of claim 22, wherein said bead covers a peripheral portion of the first surface of the integrated circuit device.

25. The package of claim 2, wherein said integrated circuit device has a side surface between the first surface and the second surface of the integrated circuit device; and said adhesive bead contacts the side surface of the integrated circuit device.

26. The package of claim 10, wherein said integrated circuit device has a side surface between the first surface and the second surface of the integrated circuit device; and said adhesive bead contacts the side surface of the integrated circuit device.

27. The package of claim 18, wherein said integrated circuit device has a side surface between the first surface and the second surface of the integrated circuit device; and said adhesive bead contacts the side surface of the integrated circuit device.

28. The package of claim 2, wherein said adhesive bead covers a peripheral portion of the first surface of the integrated circuit device.

29. The package of claim 10, wherein said adhesive bead covers a peripheral portion of the first surface of the integrated circuit device.

30. The package of claim 18, wherein said adhesive bead covers a peripheral portion of the first surface of the integrated circuit device.

31. The package of claim 28, wherein said optical integrated circuit device includes a plurality of bonding pads, and said adhesive bead covers said bonding pads.

32. A package for an integrated circuit device comprising:

a base of molded insulative material having a planar first surface;

a die pad in an embedded connection with said base at the first surface of said base, wherein a first surface of the die pad is not covered by the insulative material of the base;

a plurality of leads, said leads having a first portion in an embedded connection with said base at the first surface of said base, and a second portion extending from said base, wherein a first surface of the first portion of each lead is not covered by the insulative material of the base;

an integrated circuit device having a first surface and an opposite second surface, wherein the first surface of the integrated circuit device includes a light sensitive portion, and the second surface of the integrated circuit device is on the first surface of the die pad;

an optically clear package cover in an adhesive connection with the first surface of the base around the integrated circuit device, said cover having a central cavity and enclosing said integrated circuit device.

33. The package of claim 32, wherein said package cover has a planar portion above said integrated circuit device.

34. The package of claim 32, wherein the package cover includes a means for preventing scratches to a surface of the planar portion of the cover.

35. The package of claim 32, wherein the die pad has a second surface opposite the first surface of the die pad, and a side surface between said first surface and said second surface, and the second surface and side surface of the die pad are covered by the insulative material of the base;

the first portion of each of said leads has a second surface opposite the first surface of the first portion of the lead, and a side surface between the first surface and the second surface, and the second surface and side surface of the first portion of each lead are covered by the insulative material of the base; and the side surface of the die pad and the side surface of the first portion of the leads include a reentrant portion in contact with said insulative material of the base.

36. The package of claim 35, wherein said package cover has a planar portion above said integrated circuit device.

37. The package of claim 2, wherein the first portion of at least some of said leads further include anchor ears extending from the side surface of the respective lead.

38. The package of claim 2, wherein the first portion of at least some of said leads further include a hole extending vertically through the respective lead, said hole being partially filled with the molded insulative material of the base.

39. The package of claim 6, wherein said means protect against vertical pulling of the die pad and the first portion of the leads from their respective embedded connections.

40. The package of claim 32, wherein said package cover includes a planar portion over said integrated circuit device, and a projection extending vertically from said planar portion.

* * * * *

UNITED STATES PATENT AND TRADEMARK OFFICE
CERTIFICATE OF CORRECTION

PATENT NO. : 6,274,927 B1
DATED : August 14, 2001
INVENTOR(S) : Thomas P. Glenn

It is certified that error appears in the above-identified patent and that said Letters Patent is hereby corrected as shown below:

Column 6,
Line 24, after "3" insert -- and --; and

Column 9,
Line 12, delete "in" and insert -- by --.

Signed and Sealed this

Twenty-eighth Day of January, 2003

JAMES E. ROGAN
*Director of the United States Patent and Trademark Office*